US009473086B2

(12) United States Patent
Laturell et al.

(10) Patent No.: US 9,473,086 B2
(45) Date of Patent: Oct. 18, 2016

(54) HIGH-VOLTAGE VOLTAGE-SWITCHED CLASS-S AMPLIFIER

(71) Applicant: LSI Corporation, San Jose, CA (US)

(72) Inventors: Donald R. Laturell, Oak Hill, FL (US); Said E. Abdelli, Minneapolis, MN (US); Peter Kiss, Basking Ridge, NJ (US); James F. MacDonald, Mendota Heights, MN (US); Ross S. Wilson, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 67 days.

(21) Appl. No.: 14/380,823

(22) PCT Filed: Jan. 18, 2013

(86) PCT No.: PCT/US2013/022318
§ 371 (c)(1),
(2) Date: Aug. 25, 2014

(87) PCT Pub. No.: WO2014/113027
PCT Pub. Date: Jul. 24, 2014

(65) Prior Publication Data
US 2015/0042403 A1 Feb. 12, 2015

(51) Int. Cl.
*H03F 3/217* (2006.01)
*H03F 3/193* (2006.01)
*H03F 3/24* (2006.01)

(52) U.S. Cl.
CPC ............ *H03F 3/2171* (2013.01); *H03F 3/193* (2013.01); *H03F 3/2175* (2013.01); *H03F 3/2178* (2013.01); *H03F 3/245* (2013.01); *H03F 3/217* (2013.01); *H03F 2200/451* (2013.01); *H03F 2203/21136* (2013.01); *H03F 2203/21178* (2013.01)

(58) Field of Classification Search
CPC .................. H03F 2200/451; H03F 2200/331; H03F 1/0222; H03F 3/189; H03F 2200/102; H03F 1/025; H03F 2200/504; H03F 1/02; H03F 2200/511; H03F 1/00; H03F 1/32; H03F 3/19; H03F 3/21; H03F 2200/336; H03F 3/2171; H03F 3/2178; H03F 3/193; H03F 3/245; H03F 2203/21178; H03F 3/2175; H03F 2203/21136; H03F 3/217
USPC .............................................. 330/207 A, 251
See application file for complete search history.

(56) References Cited

U.S. PATENT DOCUMENTS

| | | | |
|---|---|---|---|
| 5,838,193 A * | 11/1998 | Myers .................... | H03F 3/2171 330/10 |
| 6,370,245 B1 | 4/2002 | White | |
| 2002/0190792 A1 | 12/2002 | Yokoyama et al. | |
| 2005/0286652 A1 | 12/2005 | MacPhail et al. | |
| 2007/0247221 A1 | 10/2007 | Sorrells et al. | |
| 2009/0128236 A1 | 5/2009 | Wilson | |
| 2010/0231297 A1 * | 9/2010 | Buitendijk ................ | H03F 1/26 330/251 |
| 2012/0314734 A1 * | 12/2012 | Zierdt .................. | H03H 7/0115 375/219 |

* cited by examiner

*Primary Examiner* — Khanh V Nguyen

(57) ABSTRACT

A voltage-switched class-S amplifier circuit includes an output stage configured to receive at least one control signal and operative to generate an output signal as a function of the at least one control signal. The amplifier circuit further includes a driver circuit coupled with the output stage. The driver circuit is configured to receive an input bit stream signal and is operative to generate the control signal as a function of the input bit stream signal in such a manner that a common mode component is eliminated from the control signal.

20 Claims, 4 Drawing Sheets

HIGH-VOLTAGE VOLTAGE-SWITCHED CLASS-S AMPLIFIER

CROSS-REFERENCE TO RELATED APPLICATION(S)

The present application is a national stage entry, under 35 U.S.C. §371, of PCT International Patent Application No. PCT/US2013/022318 filed on Jan. 18, 2013, the complete disclosure of which is expressly incorporated herein by reference in its entirety for all purposes.

BACKGROUND

A voltage-switched class-S (VSCS) power amplifier provides an important advantage over other amplifier types in that it exhibits relatively low output impedance. Unfortunately, however, a VSCS amplifier architecture requires a floating voltage source for driving an output stage of the amplifier, which necessitates voltage level shifting. In high-voltage applications in which a VSCS amplifier is often used, traditional methods of level shifting will generally violate breakdown voltage ratings (e.g., gate oxide breakdown voltage) for transistor devices used in the output stage of the amplifier. Furthermore, with traditional methods of level shifting it is unlikely that the output stage will switch fast enough to meet rise and fall time requirements necessary for high-speed (e.g., greater than one gigahertz) applications.

SUMMARY

Embodiments of the present invention provide techniques for achieving a floating high-speed digital driver for a VSCS power amplifier which eliminates a gate oxide breakdown problem found in conventional approaches.

In accordance with an embodiment of the invention, a VSCS amplifier circuit includes an output stage configured to receive at least one control signal and operative to generate an output signal as a function of the at least one control signal. The VSCS amplifier circuit further includes a driver circuit coupled with the output stage. The driver circuit is configured to receive an input bit stream signal and is operative to generate the control signal as a function of the input bit stream signal in such a manner that a common mode component is eliminated from the control signal.

In accordance with another embodiment of the invention, a driver circuit for use with a high-voltage VSCS amplifier circuit includes a driver stage configured for connection with an output stage of the amplifier circuit. The driver stage is configured to receive at least one control signal and to generate at least one drive signal for driving the output stage of the amplifier circuit as a function of the control signal. The driver circuit further includes an isolation circuit connected with the driver stage. The isolation circuit is configured to receive an input bit stream signal supplied to the driver circuit and is operative to generate the control signal as a function of the input bit stream signal in such a manner that a common mode component is eliminated from the control signal.

Embodiments of the invention will become apparent from the following detailed description thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
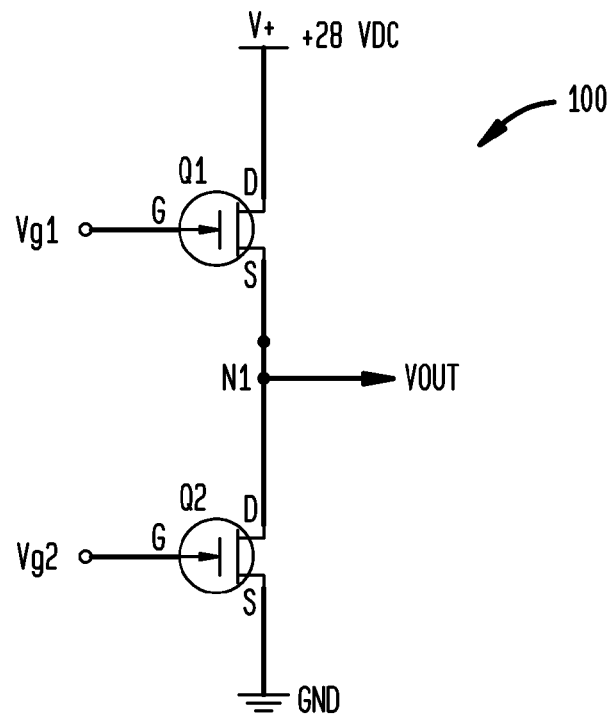
FIG. 1 is a schematic diagram depicting at least a portion of an exemplary output stage 100 which can be modified to incorporate embodiments of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments of the invention will be described herein in the context of illustrative voltage generator circuits operative to achieve a floating high-speed digital drive for a VSCS power amplifier. It should be understood, however, that embodiments of the invention are not limited to these or any other particular voltage generator circuits. Rather, embodiments of the invention are more broadly related to techniques for forming floating high-speed drive signal for a VSCS amplifier which does not violate gate oxide breakdown ratings for transistor devices in an output stage of the amplifier. Moreover, it will become apparent to those skilled in the art given the teachings herein that numerous modifications can be made to the illustrative embodiments shown that are within the scope of the claimed invention. That is, no limitations with respect to the embodiments shown and described herein are intended or should be inferred.

As a preliminary matter, for purposes of clarifying and describing embodiments of the invention, the following table provides a summary of certain acronyms and their corresponding definitions, as the terms are used herein:

| Table of Acronym Definitions | |
|---|---|
| Acronym | Definition |
| VSCS | Voltage-switched class-S |
| MISFET | Metal-insulator-semiconductor field-effect transistor |
| MOSFET | metal-oxide-semiconductor field-effect transistor |
| PFET | P-channel field-effect transistor |
| PMOS | P-channel metal-oxide-semiconductor |
| NFET | N-channel field-effect transistor |
| NMOS | N-channel metal-oxide-semiconductor |
| CMOS | Complementary metal-oxide-semiconductor |
| BJT | Bipolar junction transistor |
| MOS | Metal-oxide-semiconductor |
| CSCS | Current-switched class-S |
| DC | Direct current |
| IGBT | Insulated-gate bipolar transistor |
| LDMOS | Laterally-diffused MOSFET |
| SWPA | Switching power amplifier |
| HEMT | High electron mobility transistor |

Throughout the description herein, the term MISFET is intended to be construed broadly and to encompass any type of metal-insulator-semiconductor field-effect transistor. The term MISFET is, for example, intended to encompass semiconductor field-effect transistors that utilize an oxide material as their gate dielectric (i.e., metal-oxide-semiconductor field-effect transistors (MOSFETs)), as well as those that do not. In addition, despite a reference to the term "metal" in the acronym MISFET, the term MISFET is also intended to encompass semiconductor field-effect transistors wherein the gate is formed from a non-metal, such as, for instance, polysilicon.

Although implementations of embodiments of the invention described herein may be implemented using p-channel MISFETs (hereinafter called "PFETs" or "PMOS" devices) and/or n-channel MISFETs (hereinafter called "NFETs" or "NMOS" devices), as may be formed using a complementary metal-oxide-semiconductor (CMOS) fabrication process, it is to be appreciated that the embodiments of the invention are not limited to such transistor devices and/or such a fabrication process, and that other suitable devices, such as, for example, bipolar junction transistors (BJTs), FinFETs, etc., and/or fabrication processes (e.g., bipolar, BiCMOS, etc.), may be similarly employed, as will be understood by those skilled in the art. Moreover, although embodiments of the invention are typically fabricated in a silicon wafer, embodiments of the invention can alternatively be fabricated in wafers comprising other materials, including but not limited to gallium arsenide (GaAs), indium phosphide (InP), etc.

FIG. 1 is a schematic diagram depicting at least a portion of an output stage 100 which can be modified to implement embodiments of the invention. The output stage 100 includes a first NFET, Q1, and a second NFET, Q2. NFET Q1 has a drain (D) connected with a first voltage supply, V+ (e.g., 28 volts), a source (S) connected with a first node, N1, which forms an output of the output stage, and a gate (G) adapted to receive a first control signal, Vg1. NFET Q2 has a source connected with a second voltage supply, which is ground (GND) in this embodiment, a drain connected with node N1, and a gate adapted to receive a second control signal, Vg2. An output signal, Vout, of the output stage 100 is generated at node N1.

It is to be appreciated that, because many metal-oxide-semiconductor (MOS) devices are symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

Figure 2:
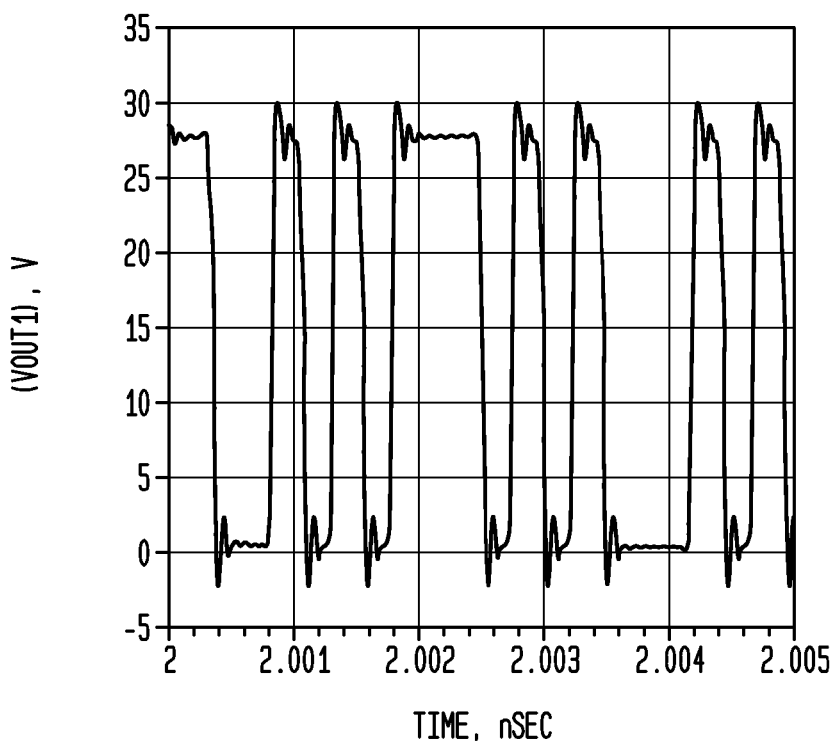
FIG. 2 is a graph illustrating an exemplary switching of an output signal of the output stage shown in FIG. 1.

In order to turn Q1 on or off, the first control signal Vg1 supplied to the gate of Q1 must switch between about zero and about −3.5 volts with respect to its source. Unfortunately, the output signal VOUT will switch between zero and 28 volts. FIG. 2 is a graph illustrating an exemplary switching of the output signal Vout generated by the output stage 100 shown in FIG. 1. In order for the gate drive of Q1 to be essentially unaffected by the output voltage swing, a voltage level shifter must be employed for control signal Vg1, since the source of Q1 is connected to the output node N1. Depending on transistor type, a level shifter device applied to the gate of Q1, switching with respect to ground, will cause the gate of Q1 to switch between nearly 0 and 28 volts, resulting in a breakdown of the gate dielectric (e.g., gate oxide) and/or the conductive gate (e.g., polysilicon or metal gate) in Q1. Moreover, it is unlikely that the output stage 100 will switch fast enough, using more traditional level shifting techniques, to meet rise and fall time requirements necessary for proper operation at high speeds (e.g., greater than about 4 GHz).

Figure 3:
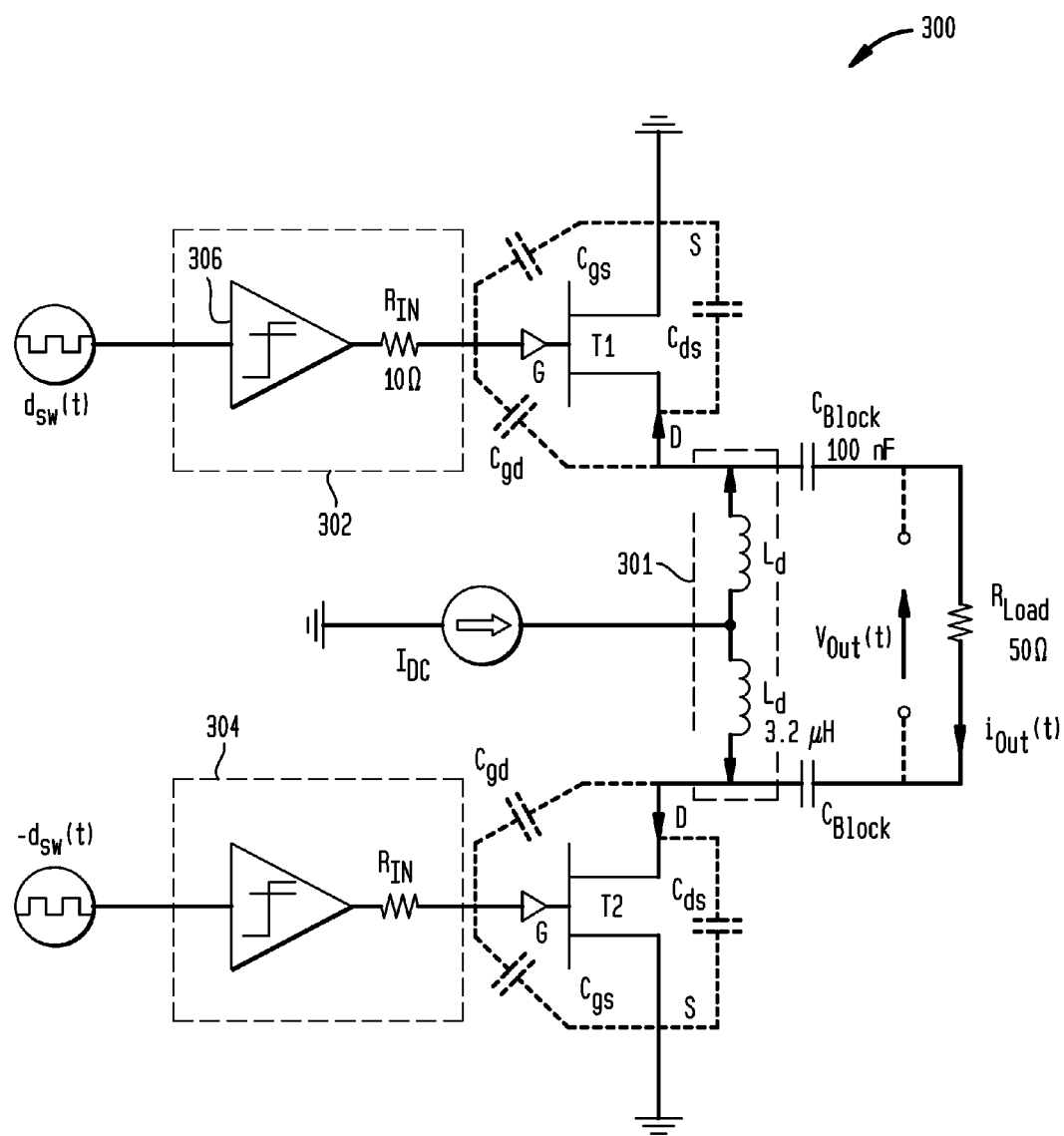
FIG. 3 is a schematic diagram depicting at least a portion of an illustrative current-switched class-S amplifier, which can be modified to incorporate embodiments of the invention.
Figure 4:
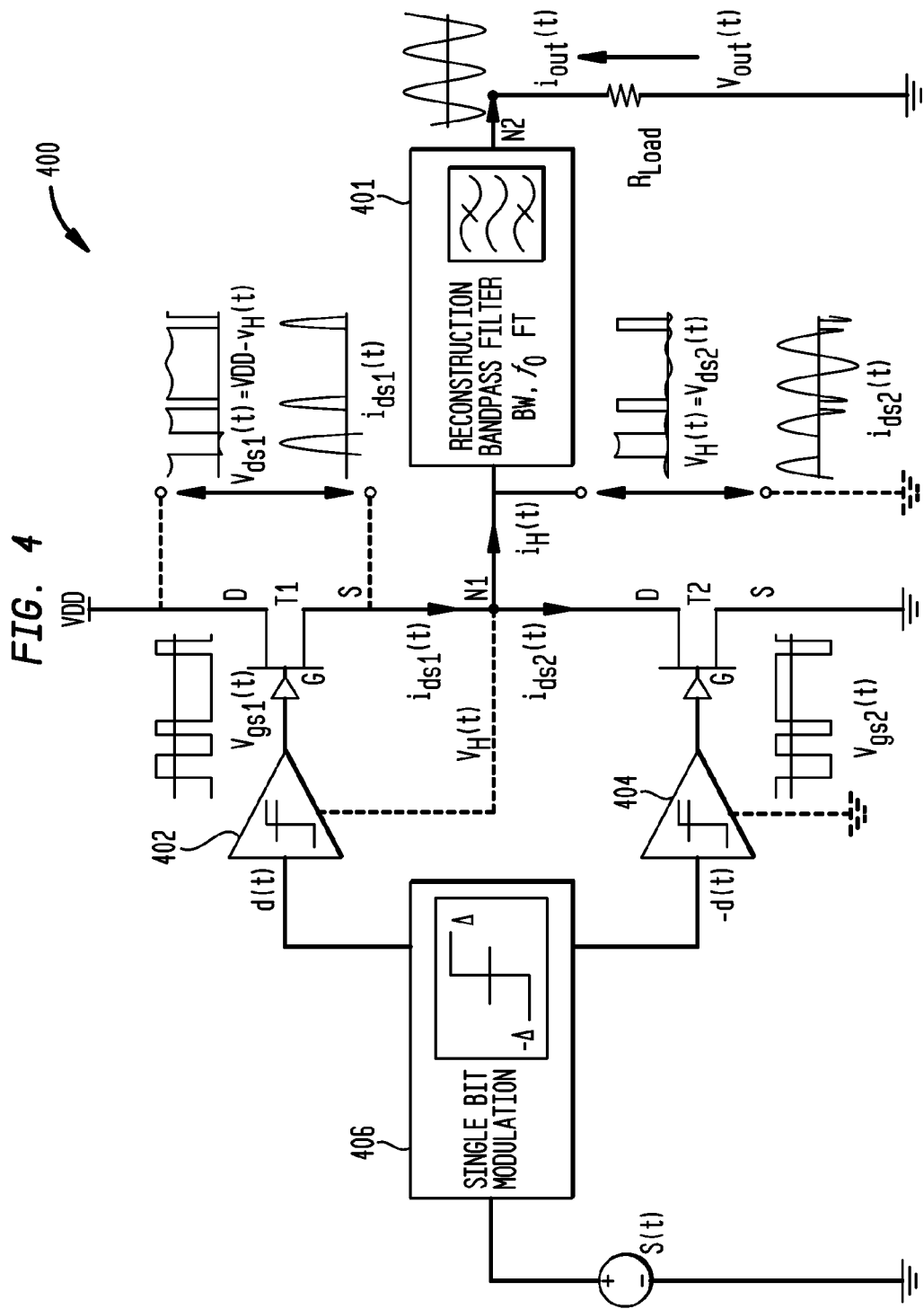
FIG. 4 is a schematic diagram depicting at least a portion of an illustrative VSCS amplifier, which can be modified to incorporate embodiments of the invention.

FIGS. 3 and 4 are schematic diagrams depicting at least portions of a current-switched class-S (CSCS) amplifier 300 and a VSCS amplifier 400, respectively, each of which can be modified to incorporate embodiments of the invention, according to the teachings herein. With reference to FIG. 3, the CSCS amplifier 300 includes a pair of NFETs, T1 and T2. Sources of NFETs T1 and T2 are connected to ground, gates of T1 and T2 are adapted to receive respective control signals, and drains of T1 and T2 are connected together through a loading circuit. The NFETS T1 and T2 are shown with primary capacitances, including gate-to-source capacitance, $C_{gs}$, gate-to-drain capacitance, $C_{gd}$, and drain-to-source capacitance, $C_{ds}$.

The loading circuit comprises a pair of blocking capacitors, $C_{Block}$, each capacitor having a first terminal connected with a drain of a corresponding transistor device (T1 or T2) and having a second terminal coupled with respective terminals of a load resistor, $R_{Load}$, which in this example is fifty ohms. An output signal, $v_{Out}(t)$, generated by the amplifier 300 is measured across the load resistor $R_{Load}$, and an output current, $i_{Out}(t)$, generated by the amplifier flows through the load resistor. A direct current (DC) common mode value of the output of amplifier 300 is established by feeding a pair of uncoupled inductors, with the inductors ideally viewed as current sources having a current value $I_{DC}$. In practice, however, the pair of uncoupled inductors do not behave as true current sources due, at least in part, to the presence of parasitic terms. As such, it is more difficult to transfer power to a load element using the CSCS amplifier 300. Each of the inductors has an inductance of about 3.2 microhenries (μH) in this illustration.

With continued reference to FIG. 3, the CSCS amplifier 300 further includes driver and level shifter circuits, 302 and 304, operative to generate respective control signals supplied to the gates of NFETs T1 and T2. Specifically, a first driver and level shifter circuit 302 includes a driver 306 having an input adapted to receive a first control signal, $d_{SW}(t)$, which in this example is a 28-volt square wave signal, and an output coupled with a series resistor, $R_{IN}$, having a value of about ten ohms. The resistor $R_{IN}$ is indicative of an output impedance of the driver 306. Ideally, the driver 306 operates between Vg=0 and Vg=Vp, where Vp is the gate voltage at which point no source-drain current flows. The driver 306 integrates a level shift circuit which generates an output signal supplied to the gate of NFET T1 that switches from about one volt and about negative six volts. The driver and level shifter circuit 304 is implemented in manner consistent with the driver and level shifter circuit 302, but receives a second input control signal, $-d_{SW}(t)$, which is 180 degrees out of phase with the first input control signal $d_{SW}(t)$.

Since the NFETs T1 and T2 in the CSCS amplifier 300 operate with respect to ground (i.e., sources of T1 and T2 are connected to ground), driving the gates of T1 and T2 is relatively easy to accomplish. However, an inherent output impedance of the CSCS amplifier 300 is relatively high (e.g., about 70 ohms), thus making it difficult for the amplifier to transfer power into a standard 50-ohm load at a practical operating voltage (e.g., about 30 volts or less).

With reference now to FIG. 4, the VSCS amplifier 400 includes a first NFET, T1, having a drain connected with a voltage supply of the amplifier, which is VDD in this example, a gate adapted to receive a first control signal, $v_{gs1}(t)$, and a source connected with a first node, N1. The amplifier 400 includes a second NFET, T2, having a drain connected with node N1, a gate adapted to receive a second control signal, $v_{gs2}(t)$, and a source connected to ground, in this example. A first current, $i_{ds1}(t)$, is generated by NFET T1 and a second current, $i_{ds2}(t)$, is generated by NFET T2. A voltage, $v_H(t)$, generated at node N1 represents an output of the amplifier 400 prior to filtering. A bandpass filter 401 is coupled with node N1. The bandpass filter 401 is operative to receive an input current, $i_H(t)$, which is indicative of a difference between the currents $i_{ds1}(t)$ and $i_{ds2}(t)$ in the two NFETS T1 and T2, respectively, and to generate an output current, $i_{Out}(t)$, at a second node, N2, which is supplied to a load resistor, $R_{Load}$, which is about 50 ohms in many applications. An output voltage, $v_{Out}(t)$, generated by the VSCS amplifier 400 is developed across the load resistor $R_{Load}$.

Amplifier 400 further includes first and second driver and level shifter circuits, 402 and 404, operative to generate the control signals $v_{gs1}(t)$ and $v_{gs2}(t)$ supplied to the gates of NFETs T1 and T2, respectively. The first driver and level shifter circuit 402 is adapted to receive a first signal, d(t), and the second driver and level shifter circuit 404 is adapted to receive a second signal, −d(t), which is 180 degrees out of phase with the first signal d(t). The driver and level shifter circuits 402 and 404 can be implemented in manner consistent with the driver and level shifter circuits 302 and 304, respectively, shown in FIG. 3. The signals d(t) and −d(t) are generated by a modulation circuit 406 coupled with inputs of the driver and level shifter circuits 402 and 404. The modulation circuit 406 is, in this example, includes a single-bit modulator operative to generate the signals d(t) and −d(t) as a function of an input signal, s(t), supplied to the amplifier 400.

The VSCS amplifier 400 exhibits an output impedance that is substantially low, especially compared to the CSCS amplifier 300 shown in FIG. 3, and is therefore well-suited to transfer power into a standard 50-ohm load at a practical operating voltage. However, the gate voltage of the upper NFET T1 has a common mode component, $v_{out}(t)$, associated therewith, which makes it difficult to drive T1. Thus, in accordance with embodiments of the invention, the common mode component is beneficially eliminated from the drive signal, thereby making it easier to drive an output stage in a VSCS amplifier.

Figure 5:
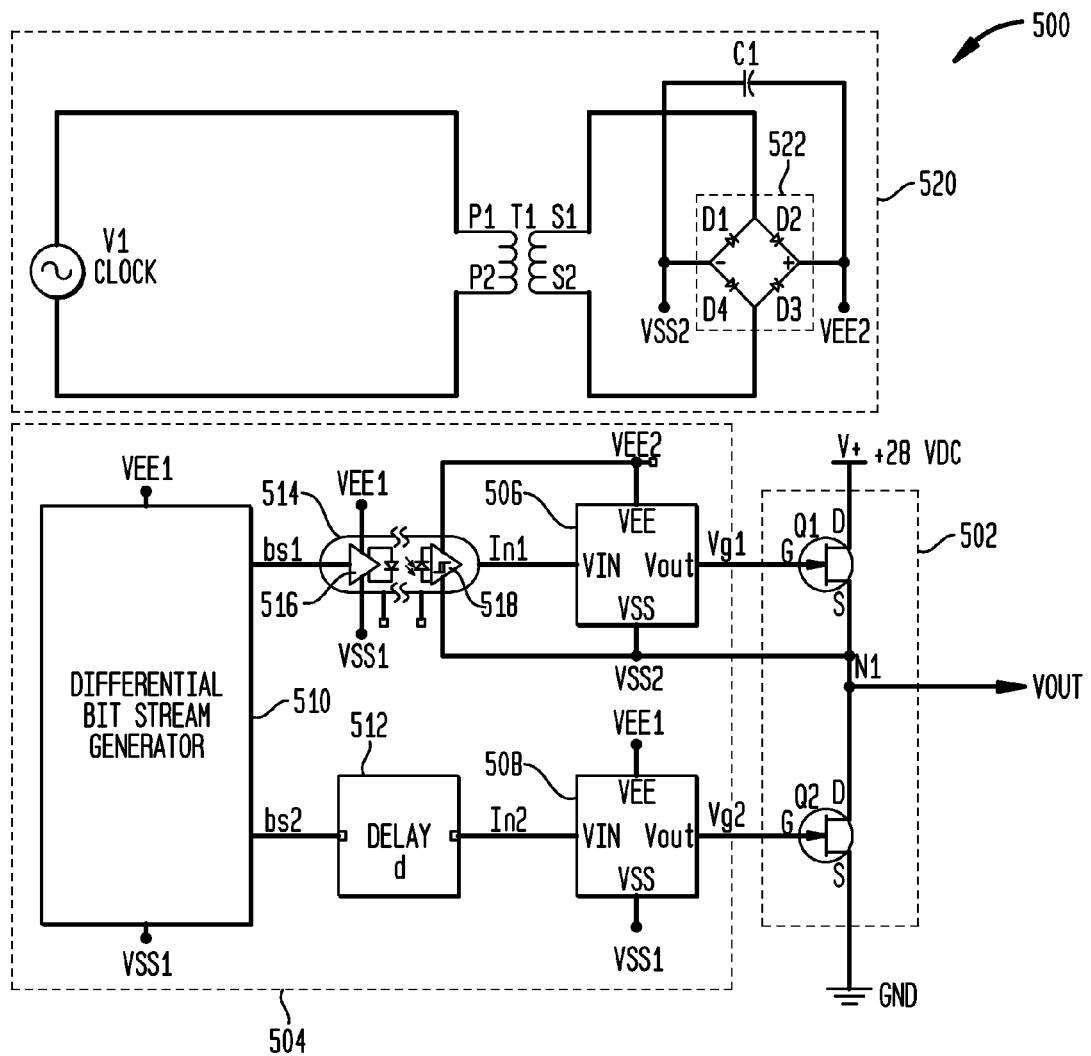
FIG. 5 is a schematic diagram depicting at least a portion of an exemplary VSCS amplifier, according to an embodiment of the invention.

FIG. 5 is a schematic diagram depicting at least a portion of an exemplary VSCS amplifier 500, according to an embodiment of the invention. The amplifier 500 includes an output stage 502 and a driver circuit 504 coupled with the output stage. Advantageously, the VSCS amplifier 500 is configured such that a common mode component is eliminated from a gate drive signal, as will be described in further detail below.

The output stage 502 of the VSCS amplifier 500 comprises a pair of NFET devices, Q1 and Q2, although embodiments of the invention are not limited to NFETs. For example, Q1 and/or Q2 may be implemented using an insulated-gate bipolar transistor (IGBT), laterally-diffused MOSFET (LDMOS), gallium nitride based high electron mobility transistor (HEMT) device, etc. A drain of Q1 is adapted for connection with a first voltage supply, which is V+ (e.g., about 28 volts) in this embodiment, a source of Q1 is connected with a drain of Q2 at an output node, N1, of the amplifier 500, and a source of Q2 is adapted for connection with a second voltage supply, which in this embodiment is ground (e.g., about zero volts). It is to be appreciated that embodiments of the invention are not limited to any specific voltage levels used for the first and second voltage supplies.

A gate of Q1 is adapted to receive a first control signal, Vg1, and a gate of Q2 is adapted to receive a second control signal, Vg2. Control signals Vg1 and Vg2 are generated by the driver circuit 504.

As apparent from FIG. 5, the driver circuit 504 is configured such that a gate signal generated by the driver circuit is electrically isolated from an input signal generator source. In this manner, a common mode component is beneficially eliminated from the gate drive signal. More particularly, the driver circuit 504 includes a first gate driver 506 and a second gate driver 508. Each of the first and second gate drivers 506 and 508, respectively, are implemented, in this embodiment, using a transistor(s) having a relatively low breakdown voltage (e.g., voltage equivalent to full drain current to cutoff current; in the case of a depletion-mode device, about 0 volts DC to about 3.5 volts DC) and capable of high-speed switching (e.g., greater than about one gigabit (Gb) per second). Drivers 506 and 508 may not necessarily comprise active components/circuits; these blocks conceptually depict how drive power is applied to the output circuit 502. By way of illustration only and without limitation, one or both of the gate drivers 506 and 508 may be implemented, for example, using CMOS or silicon-germanium (Si—Ge) Bi-CMOS driver devices which operate at speeds of up to about 6 GHz. Gate drivers based on Si—Ge devices, or a similar high-speed fabrication process, have been demonstrated to achieve sufficient drive speed and power capabilities, in accordance with embodiments of the invention. It will become apparent to those skilled in the art, given the teachings herein, that other gate driver devices and/or driver circuit implementations may be employed that are within the scope of embodiments of the invention.

The first gate driver 506 is operative to receive a first signal, In1, which is substantially the same as signal In2 but without reference to ground, and to generate the first control signal Vg1 as a function thereof. The first control signal Vg1, in this embodiment, is referenced between a first voltage, VEE2, and a second voltage, VSS2. Voltage VSS2 is connected to the source of Q1 such that the control signal Vg1 is referenced relative to the source and gate of Q1. VSS2 essentially is independent of ground (i.e., floating). It is to be understood that embodiments of the invention are not limited to any specific voltage levels for VEE2 and VSS2. Similarly, the second gate driver 508 is operative to receive a second signal, In2, and to generate the second control signal Vg2 as a function thereof. The second control signal Vg2, in this embodiment, is referenced between a third voltage, VEE1, and a fourth voltage, VSS1, although embodiments of the invention are not limited to any specific voltage levels for VEE1 and VSS1. Voltage VSS1 is connected to the source of Q2 such that the control signal Vg2 is referenced relative to the source and gate of Q2. In one embodiment, a differential between voltages VEE1 and VSS1, and between voltages VEE2 and VSS2, are in the range of about five volts.

The driver circuit 504 further includes a differential bit stream generator 510 operative to generate differential signals, bs1 and bs2, comprised of pulses which switch between voltage levels VSS1 and VEE1. In alternative embodiments, the bit stream generator 510 may reside externally with respect to the driver circuit 504. The signals bs1 and bs2 generated by the bit stream generator 510 are logically complementary (i.e., 180 degrees out of phase) relative to one another. Bit stream signal bs2 is fed through a delay element 512 having a prescribed delay, d, associated therewith. The delay element 512 is operative to receive, as an input, bit stream signal bs2 and to generate the second signal In2 as a delayed version of the bit stream signal bs2 (i.e., In2=bs2·d). The value of delay d of the delay element 512 is ideally made equal to an inherent delay associated with an isolation element 514 coupled in a signal path of bit stream signal bs1, so that the respective delays through the two bit stream signal paths are substantially the same. In one embodiment, the voltage VSS1 is equal to or less than ground. In this manner, transistor Q2 in the output stage 502 can be turned off completely, since a depletion-mode device operates at a negative gate potential with respect to its source. It is to be appreciated, however, that the gate drive requirements for a given device will be a function of the device type, and therefore embodiments of the invention are not limited to a voltage VSS1 that is less than ground potential.

In order to remove a common mode component from the drive signal Vg1, a gate drive signal path is electrically isolated from its input signal source, and the driver 506 is referenced between voltages VEE2 and VSS2, as previously stated. In this embodiment, a primary common mode component is a parasitic capacitance of a transformer T1, in a signal generator circuit 520 used to supply the voltages VEE2 and VSS2 to the first gate driver 506 (further details of which are provided herein below), and isolation element 514 with respect to the ground node in block 502. The parasitic terms are so small that the common mode voltage that appears across the transformer T1 and isolation element 514 do not significantly affect the gate drive waveform, nor do they violate gate-source breakdown requirements. Additionally, it should be noted that VSS1 in this embodiment is connected to ground.

Since the bit stream generator 510 generates differential output signals bs1 and bs2 that are referenced between VEE1 and VSS1, the isolation element 514 incorporates a voltage level shifter functionality in a signal path between the bit stream generator and the driver 506. The voltage level shifter functionality of isolation element 514 is adapted to electrically isolate signal In1 from signal bs1. In this embodiment, the isolation element 514 comprises an optical element in the form of an optical isolator, also referred to as an opto-isolator, optical coupler, optocoupler, photocoupler, etc. An optical isolator is a device having an input that is electrically isolated from its output and is designed to instead transfer electrical signals between its input and output by utilizing light waves, thereby preventing high voltages or rapidly changing voltages on one side of a circuit from damaging components or distorting transmissions on another side of the circuit. It is to be understood that embodiments of the invention are not limited to optical means for performing the electrical isolation function in the isolation element 514.

An input stage of the isolation element 514, in this embodiment, comprises an optical transmitter 516 referenced to voltage supplies VEE1 and VSS1, and an output stage of the isolation element comprises an optical receiver 518 referenced to voltage supplies VEE2 and VSS2. In essence, the optical isolator connects input and output stages with a beam of light modulated by input current. It transforms the input signal bs1 into light, sends it across a dielectric channel, captures light on the output side, and transforms the transmitted light back into the electrical signal In1. Unlike transformers, however, which pass energy in both directions with low losses, optical isolators are generally unidirectional and cannot transmit power. A switching capability of the isolation element 514 is designed to support prescribed switching speeds (e.g., greater than about one Gb/s).

With continued reference to FIG. 5, the voltages VEE2 and VSS2 supplied to the first gate driver 506 and the isolation element 514 are generated by the signal generator circuit 520, as previously stated. The signal generator circuit 520 is shown integrated in the VSCS amplifier 500, although the signal generator circuit, in other embodiments, may be external to the amplifier. As apparent from FIG. 5, the signal generator circuit 520 is implemented as a full-wave rectifier, including the transformer T1 having a primary winding, with terminals P1 and P2, adapted to receive an input signal, V1, which in this embodiment is a clock signal, and a secondary winding, with terminals S1 and S2, connected with a bridge rectifier circuit 522. Specifically, the bridge rectifier circuit 522 includes a first diode, D1, a second diode, D2, a third diode, D3, and a fourth diode, D4. An anode of D1 is connected with an anode of D4 and forms a negative output (−) of the signal generator circuit 520 for generating the voltage VSS2. A cathode of D1 is connected with an anode of D2 and terminal S1 of the secondary winding of transformer T1. A cathode of D2 is connected with a cathode of D3 and forms a positive output (+) of the signal generator circuit 520 for generating the voltage VEE2. An anode of D3 is connected with a cathode of D4 and terminal S2 of the secondary winding of transformer T1. A capacitor, C1, is coupled across the positive and negative outputs of the signal generator circuit 520 for filtering ripple in the output voltage.

The transformer T1, like all transformers, has a parasitic inter-winding capacitance associated therewith which appears on the gate and source of NFET Q1 with respect to ground. Consequently, transformer T1 should exhibit very low inter-winding capacitance (e.g., less than about two picofarads) so as to prevent excess load from affecting a performance of the amplifier. Furthermore, a common mode rejection of transformer T1 should be sufficiently high (e.g., greater than about 40 dB) at an amplifier switching frequency so as to prevent loss of output power. For example, a suitable transformer for use with the illustrative signal generator circuit 520 is a Sumida 4181B or 4181C, commercially available from Sumida Corporation. It is to be understood, however, that embodiments of the invention are not limited to the specific signal generator circuit 520 shown. Rather, those skilled in the art will be able to contemplate alternative circuit arrangements for the signal generator circuit 520, given the teachings herein.

At least a portion of the embodiments of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

An integrated circuit in accordance with embodiments of the invention can be employed in essentially any application and/or electronic system in which high-speed drivers are utilized. Suitable systems for implementing embodiments of the invention may include, but are not limited, to wireless communication systems, signal processors, power amplifiers (e.g., switching power amplifiers (SWPAs)), transmitters, receivers, signal generators, communication networks, etc. Systems incorporating such integrated circuits are considered part of this invention. Given the teachings of the embodiments of the invention provided herein, one of ordinary skill in the art will be able to contemplate other implementations and applications of the embodiments of the invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A voltage-switched class-S amplifier circuit, comprising:
   an output stage configured to receive at least one control signal and operative to generate an output signal as a function of the at least one control signal; and
   a driver circuit coupled with the output stage, the driver circuit being configured to receive an input bit stream signal and being operative to generate the at least one control signal as a function of the input bit stream signal, wherein the driver circuit comprises an isolation circuit connected in a signal path between the output stage and the input bit stream signal, the isolation circuit being operative to electrically isolate the input bit stream signal from the at least one control signal.

2. The amplifier circuit of claim 1, wherein the isolation circuit comprises a voltage level shifter circuit including a first stage referenced to a first voltage supply and a second stage referenced to a second voltage supply, the voltage level shifter circuit including a signal path between the first and second stages that is electrically isolated from one another.

3. The amplifier circuit of claim 2, further comprising a signal generator circuit operative to receive an input signal supplied to the amplifier circuit and to generate the second voltage supply as a function thereof.

4. The amplifier circuit of claim 3, wherein the signal generator circuit comprises a full-wave rectifier circuit, the full-wave rectifier circuit comprising:
   a bridge rectifier; and
   a transformer including a primary winding adapted to receive the input signal, and a secondary winding connected with first and second terminals of the bridge rectifier, the second voltage supply being generated across third and fourth terminals of the bridge rectifier.

5. The amplifier circuit of claim 4, wherein the transformer exhibits an inter-winding capacitance which is less than about two picofarads.

6. The amplifier circuit of claim 3, wherein the input signal is a clock signal.

7. The amplifier circuit of claim 1, wherein the isolation circuit comprises an optical isolator.

8. The amplifier circuit of claim 1, wherein the output stage comprises a differential output stage configured to receive the first control signal and at least a second control signal, and wherein the driver circuit comprises a differential driver circuit adapted to receive a differential bit stream and to generate the first and second control signals as a function of the differential bit stream, the differential driver circuit comprising:
   an isolation circuit connected in a first signal path between the differential output stage and a first input bit stream signal of the differential bit stream, the isolation circuit being operative to electrically isolate the first input bit stream signal from the first control signal; and
   a delay circuit connected in a second signal path between the differential output stage and a second input bit stream signal of the differential bit stream, the delay circuit being operative to generate the second control signal as a delayed version of the second input bit stream signal.

9. The amplifier circuit of claim 8, wherein the driver circuit further comprises a differential bit stream generator operative to generate the first and second input bit stream signals.

10. The amplifier circuit of claim 8, wherein the delay circuit has a first delay associated therewith which is configured to match a second delay associated with the isolation circuit.

11. The amplifier circuit of claim 1, wherein the driver circuit comprises a bit stream generator operative to generate the input bit stream signal.

12. The amplifier circuit of claim 11, wherein the bit stream generator comprises a differential bit stream generator operative to generate a differential input bit stream signal, the differential input bit stream signal comprising first and second input bit stream signals that are logical complements of one another.

13. The amplifier circuit of claim 1, wherein the output stage is configured to receive at least first and second control signals, the output stage comprising at least first and second n-channel field-effect transistors, a first source/drain of the first n-channel field-effect transistor being connected with a first voltage supply, a second source/drain of the first n-channel field-effect transistor being connected with a first source/drain of the second n-channel field-effect transistor, a second source/drain of the second n-channel field-effect transistor being connected with a second voltage supply, a gate of the first n-channel field-effect transistor being configured to receive the first control signal, and a gate of the second n-channel field-effect transistor being configured to receive the second control signal.

14. The amplifier circuit of claim 1, wherein at least a portion of the amplifier circuit is fabricated in at least one integrated circuit.

15. The amplifier circuit of claim 1, further comprising:
a bit stream generator operative to generate the input bit stream signal, wherein the bit stream generator is internal to the driver circuit.

16. A driver circuit for use with a high-voltage, voltage-switched class-S amplifier circuit, the driver circuit comprising:
a driver stage configured for connection with an output stage of the amplifier circuit, the driver stage being configured to receive at least one control signal and to generate at least one drive signal as a function of the at least one control signal for driving the output stage of the amplifier circuit; and
an isolation circuit connected with the driver stage, the isolation circuit being configured to receive an input bit stream signal and being operative to generate the at least one control signal as a function of the input bit stream signal.

17. The driver circuit of claim 16, wherein the driver stage comprises a differential driver stage adapted to receive a differential bit stream and to generate the first and second control signals as a function of the differential bit stream, the differential driver stage comprising:
the isolation circuit connected in a first signal path between a differential output stage connected with the driver circuit and a first input bit stream signal of the differential bit stream, the isolation circuit being operative to electrically isolate the first input bit stream signal from the first control signal; and
a delay circuit connected in a second signal path between the differential output stage and a second input bit stream signal of the differential bit stream, the delay circuit being operative to generate the second control signal as a delayed version of the second input bit stream signal.

18. The driver circuit of claim 17, wherein the delay circuit has a first delay associated therewith which is configured to match a second delay associated with the isolation circuit.

19. The driver circuit of claim 16, wherein the isolation circuit comprises a voltage level shifter circuit including a first stage referenced to a first voltage supply and a second stage referenced to a second voltage supply, the voltage level shifter circuit including a signal path between the first and second stages that is electrically isolated from one another.

20. An electronic system, comprising at least one voltage-switched class-S amplifier circuit, the at least one voltage-switched class-S amplifier circuit comprising:
an output stage configured to receive at least one control signal and operative to generate an output signal as a function of the at least one control signal; and
a driver circuit coupled with the output stage, the driver circuit being configured to receive an input bit stream signal and being operative to generate the at least one control signal as a function of the input bit stream signal, wherein the driver circuit comprises an isolation circuit connected in a signal path between the output stage and the input bit stream signal, the isolation circuit being operative to electrically isolate the input bit stream signal from the at least one control signal.

* * * * *